(12) United States Patent
Piirainen

(10) Patent No.: US 6,532,257 B1
(45) Date of Patent: Mar. 11, 2003

(54) METHOD FOR PERFORMING PHASE COMPARISON, AND PHASE COMPARATOR

(75) Inventor: Olli Piirainen, Oulu (FI)

(73) Assignee: Nokia Telecommunications Oy, Espoo (FI)

( * ) Notice: Subject to any disclaimer, the term of this patent is extended or adjusted under 35 U.S.C. 154(b) by 0 days.

(21) Appl. No.: 09/269,978

(22) PCT Filed: Aug. 18, 1998

(86) PCT No.: PCT/FI98/00634

§ 371 (c)(1),
(2), (4) Date: Apr. 28, 1999

(87) PCT Pub. No.: WO99/09654

PCT Pub. Date: Feb. 25, 1999

(30) Foreign Application Priority Data

Aug. 20, 1997 (FI) .................................................. 973421

(51) Int. Cl.⁷ .............................................. H04B 17/00
(52) U.S. Cl. ........................ 375/226; 375/371; 375/376
(58) Field of Search ................................ 375/226, 327, 375/354, 355, 370, 371, 373, 376; 331/1 A, 1 R, 18, 25; 370/516, 530; 327/1, 2, 3, 141–163

(56) References Cited

U.S. PATENT DOCUMENTS

| 4,814,726 A | 3/1989 | Byrd et al. .................. 331/1 A |
| 5,291,529 A | 3/1994 | Crook et al. ................. 375/358 |
| 5,583,458 A | * 12/1996 | Bazes ............................ 327/3 |
| 5,744,983 A | * 4/1998 | Bazes ............................ 327/3 |
| 5,920,207 A | * 7/1999 | Suresh ........................... 327/3 |
| 6,239,626 B1 | * 5/2001 | Chesavaage ................. 327/99 |

FOREIGN PATENT DOCUMENTS

| DE | 3130156 | 2/1983 |
| DE | 3813550 | 3/1989 |
| EP | 0520558 | 12/1992 |
| WO | WO 97/23047 | 6/1997 |

* cited by examiner

*Primary Examiner*—Stephen Chin
*Assistant Examiner*—Chieh M. Fan
(74) *Attorney, Agent, or Firm*—Pillsbury Winthrop LLP

(57) ABSTRACT

In a method for performing a phase comparison, and a phase comparator, two binary signals are compared using two functionally similar asynchronous state machines, which generate two output signals used for controlling a phase. A first state machine is fed a first signal to be compared, an output signal of a second state machine and a handshaking signal of the second state machine. The second state machine is fed a second signal to be compared, an output signal of the first state machine and a handshaking signal of the first state machine. The two state machines activate their respective handshaking signals after detecting activation of the signal to be compared. The handshaking signal ensures the logical operation of the phase comparator.

12 Claims, 5 Drawing Sheets

METHOD FOR PERFORMING PHASE COMPARISON, AND PHASE COMPARATOR

This application is the national phase of international application PCT/FI98/00634 filed Aug. 18, 1998 which designated the U.S.

FIELD OF THE INVENTION

The invention relates to a method for performing phase comparison, two binary signals being compared in the method by means of two asynchronous state machines, two output signals being generated by means of the same machines to control a phase.

The invention also relates to a phase comparator comprising two asynchronous state machines, which are arranged to generate two output signals to control a phase.

BACKGROUND OF THE INVENTION

A digital phase comparator is needed in the operation of for instance a phase locked loop. A phase locked loop is used in applications where a clock signal is synchronized with an external signal. A typical application is a digital radio system receiver in which the receiver synchronizes with a received signal to detect the signal.

There are various prior art phase comparator solutions. The most common solution comprises logical circuits and feedback, which function either synchronically or asynchronically. Patent EP 520 558, which will be included herein as a reference, discloses a phase comparison circuit solution comprising logical gates. In order to avoid transients, the operation of the logical circuits of the phase comparator is secured by using delay means, which are also logical gates. Transients, which occur when both of the input signals change simultaneously, are most harmful to the reliable operation of asynchronous circuits. It is not, however, desirable to use delay means when transients are to be avoided because the use of delay means requires, for instance, particularly careful circuit layout design.

SUMMARY OF THE INVENTION

An object of the invention is thus to provide a method and an equipment implementing the method to allow the above mentioned problems to be solved and the use of delay means to be avoided.

This is achieved with a method described in the preamble, characterized in that two asynchronous, functionally similar state machines are used in the method, whereby to a first state machine are fed: a first signal to be compared, an output signal of a second state machine and a handshaking signal of the second state machine, and to the second state machine are fed: a second signal to be compared, and output signal of the first state machine and a handshaking signal of the first state machine; that the first state machine activates its handshaking signal after having detected that the first signal to be compared is activated; that the second state machine activates its handshaking signal after having detected that the second signal to be compared is activated, the handshaking signal ensuring the logical operation of the method; and that, to activate the output signal detecting a phase difference in and controlling a phase of the first state machine, the following steps are taken: checking of the state of the first signal to be compared, the state of the output signal of the second state machine and the state of the handshaking signal of the second state machine; and that, to activate the output signal detecting a phase difference in and controlling a phase of the second state machine, the following steps are taken: checking of the state of the second signal to be compared, the state of the output signal of the first state machine and the state of the handshaking signal of the first state machine.

A phase comparator of the invention, in turn, is characterized in that the state machines are functionally similar, the first state machine having as input signals the first signal to be compared, the output signal of the second state machine and the handshaking signal of the second state machine; the second state machine having as input signals the second signal to be compared, the output signal of the first state machine and the handshaking signal of the first state machine; that the first state machine is arranged to generate its handshaking signal from an active edge of the first signal to be compared and the second state machine is arranged to generate its handshaking signal from an active edge of the second signal to be compared, the handshaking signals securing the logical operation of the phase comparator by detecting the active edge of each of the signals to be compared; and that, to activate the output signal detecting a phase difference in the first state machine, the first state machine is arranged to: check the state of the first signal to be compared, the state of the output signal of the second state machine and the state of the handshaking signal of the second state machine; and that, to activate an output signal detecting a phase difference in the second state machine, that second state machine is arranged to: check the state of the second signal to be compared, the state of the output signal of the first state machine and the state of the handshaking signal of the first state machine.

The method and the phase comparator provide various advantages. The solution of the invention allows separate delay means to be disposed of and the solution is well suited for digital asic circuits. The operation is secured by means of a handshaking mechanism. In addition, the structure is symmetrical, providing thus similar timings for each of the input signals and each of the output signals.

BRIEF DESCRIPTION OF THE DRAWINGS

The invention will now be described in greater detail in connection with preferred embodiments and with reference to the accompanying drawings, in which.

DETAILED DESCRIPTION OF THE INVENTION

A solution of the invention is suited for use particularly in a phase locked loop (PLL), without being, however, restricted to it. On a broader basis, the solution of the invention is applicable to a PLL receiver of a digital radio system.

Figure 1:
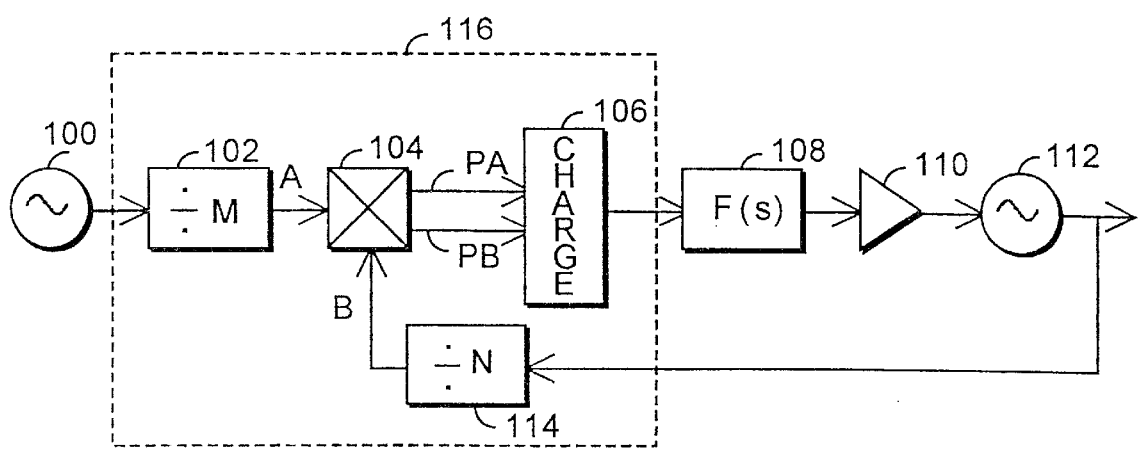
FIG. 1 is a block diagram illustrating a phase locked loop.

FIG. 1 illustrates a phase locked loop comprising a reference frequency source 100, a first divider 102, a phase comparator 104, a charge pump 106, a loop filter 108, a buffer stage 110, a voltage controlled oscillator 112 and a second divider 114. The first divider 102, the phase comparator 104, the charge pump 106 and the second divider 114 form a synthesizer circuit 116. The second divider 114 is in feedback from the voltage controlled oscillator 112 to the phase comparator 104. From the reference signal source 100, which can be for instance a signal corresponding to a frequency of a signal received by a receiver, the signal proceeds to the divider 102 where the signal frequency is decreased by applying a suitable coefficient M. In addition to a first signal to be compared, i.e. a reference signal A, a second signal B to be compared, the signal B having a frequency corresponding to the frequency of an output signal, is also fed to the phase comparator and the frequency phases are compared with each other. Both the first signal A to be compared and the second signal B to be compared are binary. The comparison produces two signals PA and PB, of which PA increases the voltage provided by the charge pump 106 and PB decreases the voltage provided by the charge pump 106. A voltage signal transmitted from the charge pump 106 is filtered in the loop filter 108 which removes disturbances from the signal. After the filtering, the signal proceeds to the buffer grade 110 which amplifies the signal to suit the oscillator 112. The greater the voltage signal used for controlling the oscillator 110 is, the higher is the frequency of the oscillator 110. The voltage the buffer 110 feeds to the voltage controlled oscillator 112 depends on the village level of the charge pump 106, the voltage level, in turn, depending on the signal phases in the phase comparator 104. Thus the frequency provided by the voltage controlled oscillator 112 is a function of the reference frequency.

Figure 2:
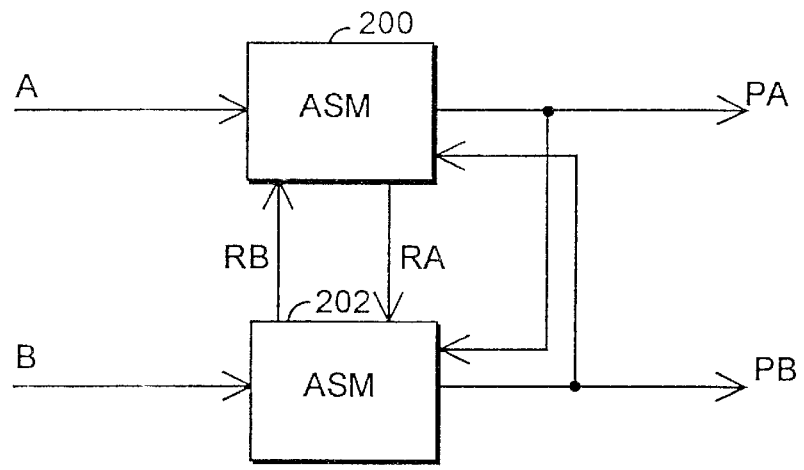
FIG. 2 is a block diagram illustrating a phase comparator.

Let us now study in greater detail the phase comparator 104 of the invention with reference to FIG. 2. The phase comparator 104 comprises two functionally similar asynchronous state machines (ASM) 200 and 202. The state machines 200 and 202 have the control signals PA and PB of the charge pump 106 as output signal. The state machine 200 receives the reference signal A, the output PB of the state machine 202 and the handshaking signal RB of the state machine 202. The state machine 202, in turn, receives the feedback signal B, the output signal of the state machine 200 and the handshaking signal RA of the state machine 200. The handshaking signal RA is active when the state machine 200 has detected an active edge in the reference signal A. Similarly, the handshaking signal RB is active when an active edge is detected in the feedback signal B. For instance a rising edge can function as an active edge. The inventive solution thus comprises two symmetric asynchronous state machines 200 and 202, symmetrically coupled together as shown in FIG. 2. The handshaking mechanism (the signals RA and RB) allows the operation of an adjacent state machine to be ensured, without delaying of the signals.

Figure 3:
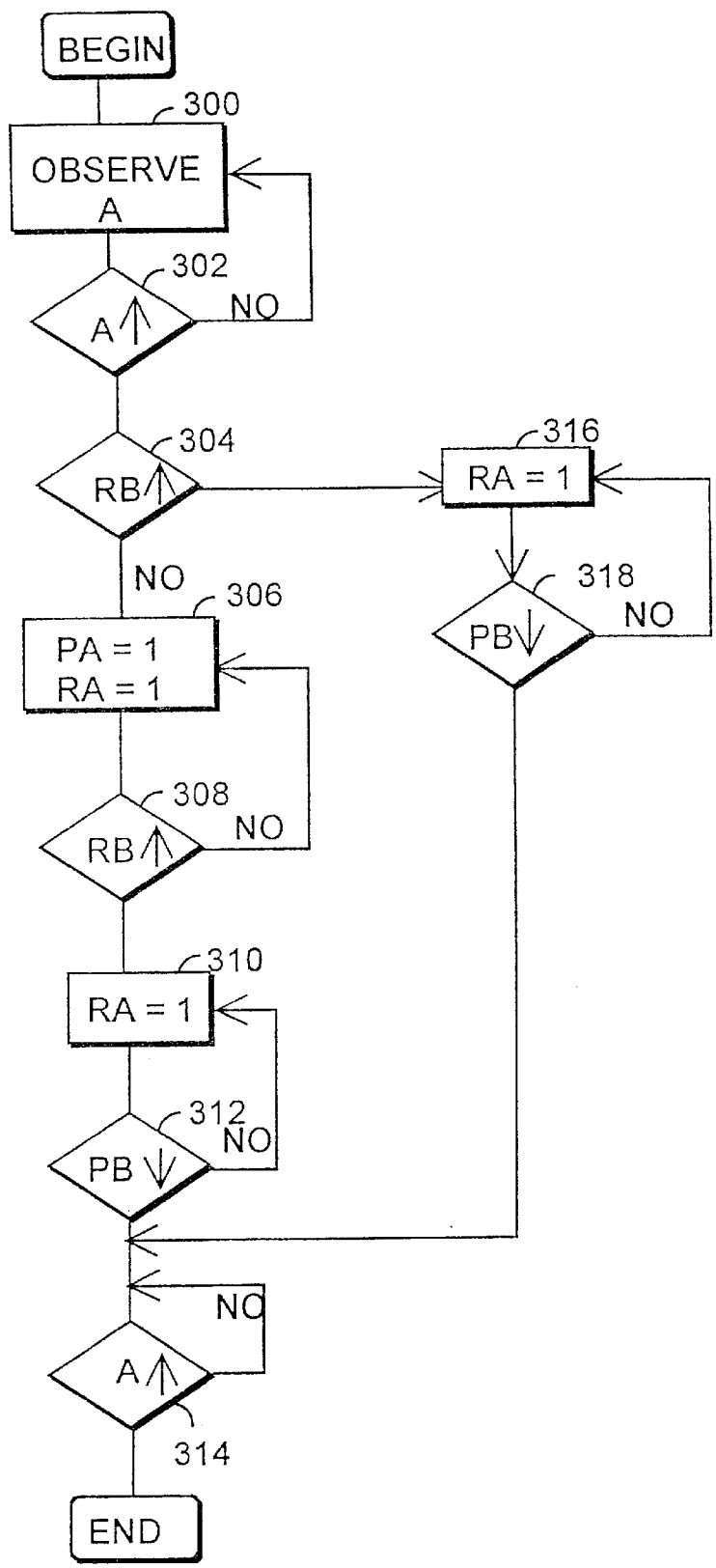
FIG. 3 is a flow diagram illustrating a first state machine.
Figure 4:
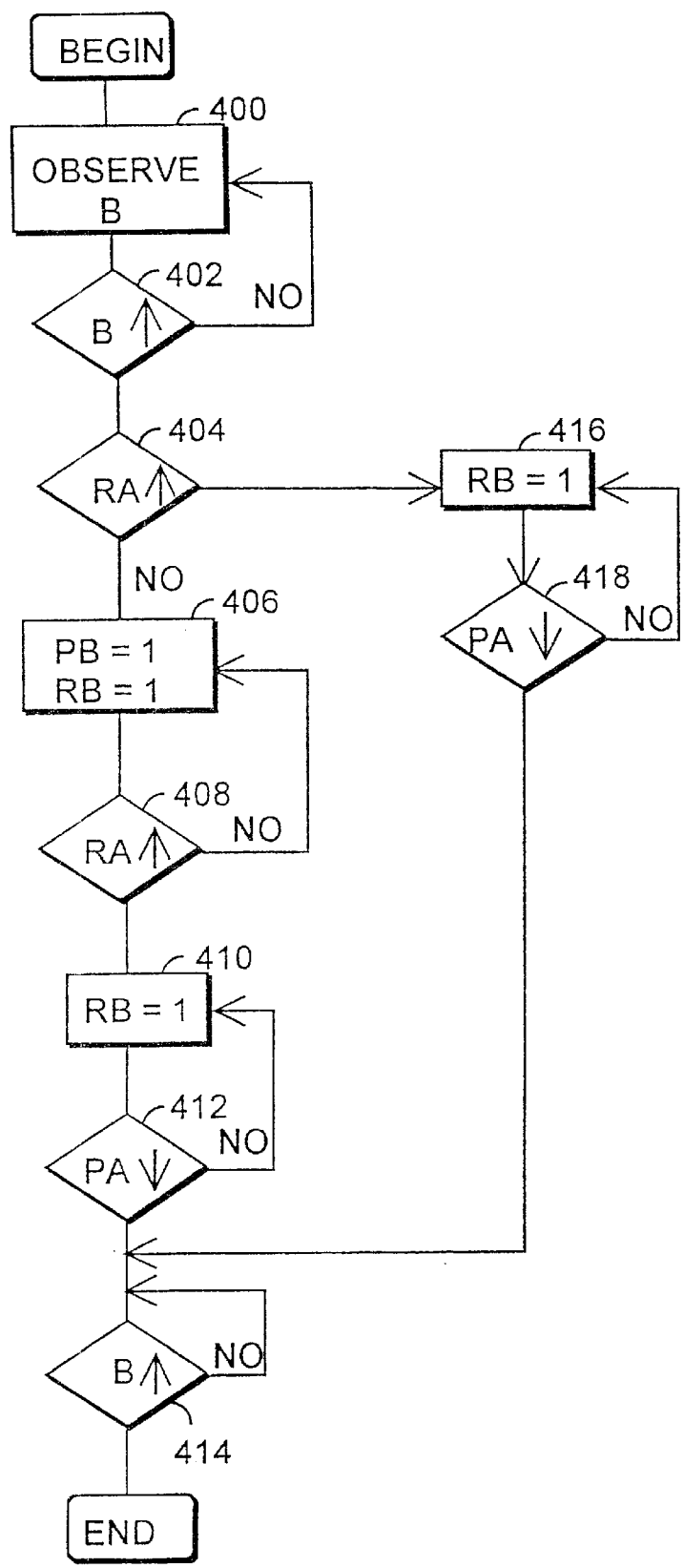
FIG. 4 is a flow diagram illustrating a second state machine.

Let us now study in greater detail the operation of the phase comparator with reference to FIGS. 3 and 4. Let us first discuss the operation of the first state machine 200. The state machine controls the activation of the reference signal A in blocks 300 and 302. When the reference signal is activated in the block 302, the process checks in a block 304 whether the handshaking signal RB of the second state machine 202 has been activated. If the handshaking signal RB has not been activated, the process continues to a block 306 where the signals PA and RA are activated. The signal PA directs the charge pump 106 to increase the output voltage of the signal and the handshaking signal RA informs the second state machine 202 that an active edge of the signal A has been detected.

If, on the other hand, the handshaking signal RB is active, the process continues to a block 316 where only the handshaking signal RA is activated to indicate that an active edge has been detected. Both of the output signals PA and PB are thus not activated at the same time. The handshaking signals RA remains active until it is detected that the output signal PB of the second state machine 202 is activated in a block 318 from where the process proceeds to wait for the state of the signal A to change.

From the block 306 the process continues to the block 303 where the handshaking signal RB of the second state machine 202 is tested. As long as the handshaking signal RB is non-active, the output signal PA and the handshaking signal RA of the first state machine are active. The greater the frequency difference between the signals A and B, shown as a phase difference in the phase comparator 104, the longer the first state machine 200 remains in the blocks 306 and 308 and the longer the output signal PA can direct the charge pump 106 to increase the voltage and the frequency of the oscillator 112 towards a frequency corresponding to the reference frequency. When the state machine 200 detects in the block 308 that the handshaking signal RB of the second state machine 202 is activated, the state machine 200 moves to a block 310 where the handshaking signal RA is kept active for as long as the output signal of the second state machine 202 is active in the block 312. The output signal PA is, however, set non-active when the process continues to the block 310. When the output signal PB of the second state machine 202 is deactivated, the process remains in the block 314 to wait for the state of the reference signal A to also change. FIG. 4 is a flow diagram illustrating the operation of the second state machine 202 in blocks 400 to 414, which correspond to the blocks 300 to 314 of the first state machine 200. The operation of the second state machine 202 is similar to that of the first state machines 200, so it is not described in any further detail. The state machine 200 can operate in place of the state machine 202 and vice versa.

Figure 5:
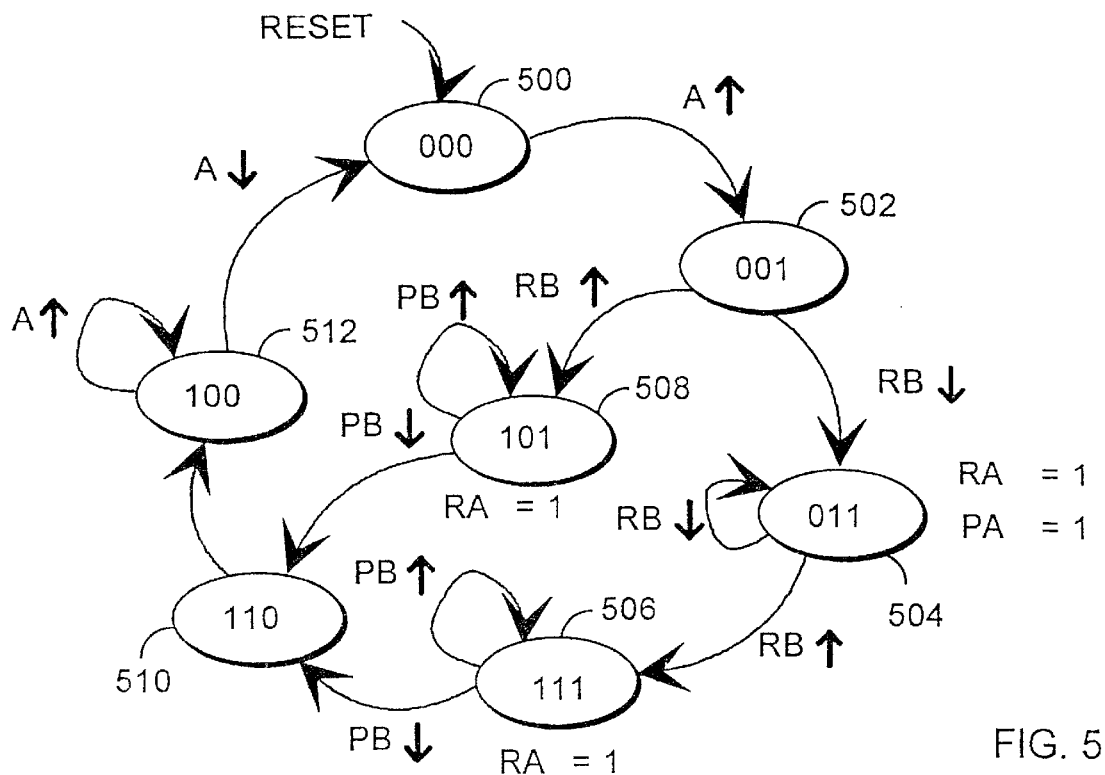
FIG. 5 is a state diagram illustrating the first state machine.
Figure 6:
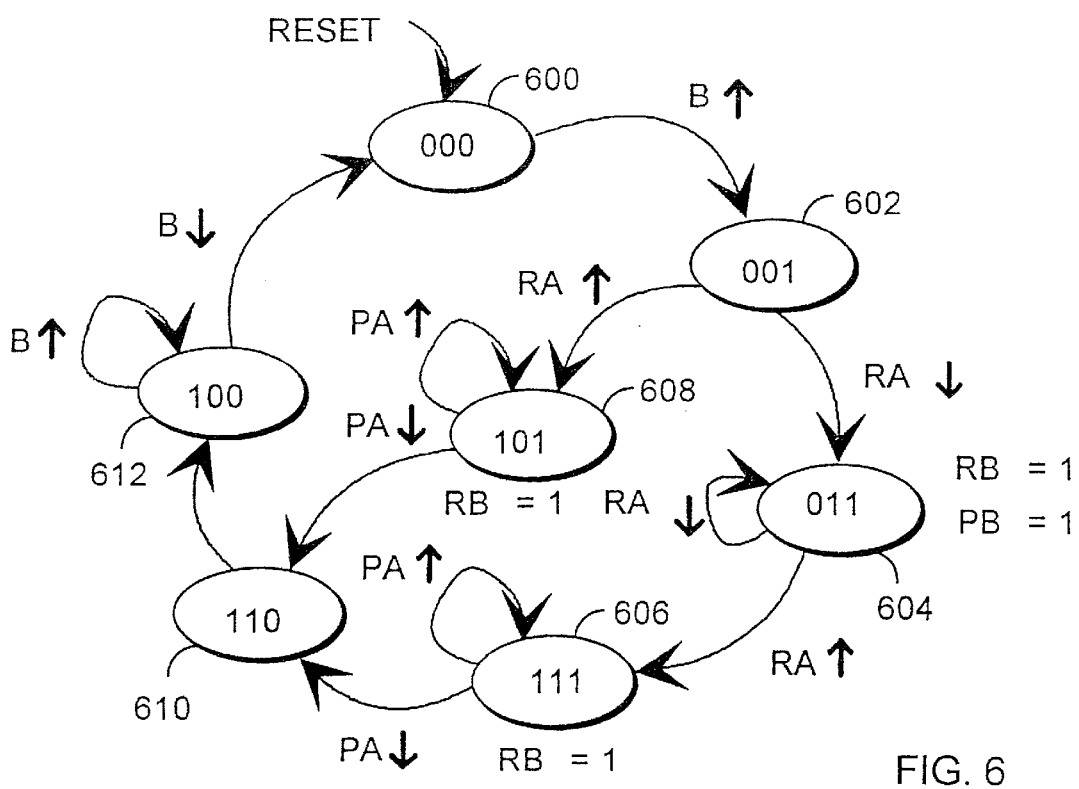
FIG. 6 is a state diagram illustrating the second state machine.

FIG. 5 is a state diagram illustrating the operation of the state machine 200 in slightly greater detail. An arrow pointing upwards next to the signal symbol indicates the activation of the signal and an arrow pointing downwards indicates deactivation. Every active signal of the first state machine 200 is deactivated in a state transition, unless the signal in question is re-activated at the state following the state transition. Each state in the state diagram can be shown by three bits and the states are advantageously coded so as to differ from each other by only one bit. The state machine 200 maintains its initial state 000 until the reference signal A is activated. As the reference signal is activated, the state machine 200 moves to a state 001 from where transition direct to a state 011 or 101 takes place, depending on whether the handshaking signal RB of the second state machine 202 is active or not. If the handshaking signal RB is non-active, the process moves to the state 110, remaining there for as long as RB is non-active. At the same time, the handshaking signal RA and the output signal PA of the state machine 200 are kept active for as long as the process stays at the state 011. When the handshaking signal of the second state machine 202 is activated, the process continues to a state 111 and the output signal PA of the first state machine is deactivated. The handshaking signal RA is, however, still kept active. The process moves from the state 111 to a state 110 when the handshaking signal PB of the second state machine 202 is deactivated. The state 110 is also entered from the state 101, whereto the process moves from the state 001, if the handshaking signal RB of the second state machine 202 is active. The state 101 is maintained until the output signal of the second state machine 202 is deactivated, after which the process moves to the state 110. From the state 110 the process moves direct to the state 100 to wait, when necessary, for the reference signal of the first state machine 200 to deactivate. FIG. 6 illustrates a similar state diagram of the second state machine 202, so it is not described here in greater detail. States 600 to 612 of the second state machine 202 correspond to states 500 to 512 of the first state machine 200.

Figure 7:
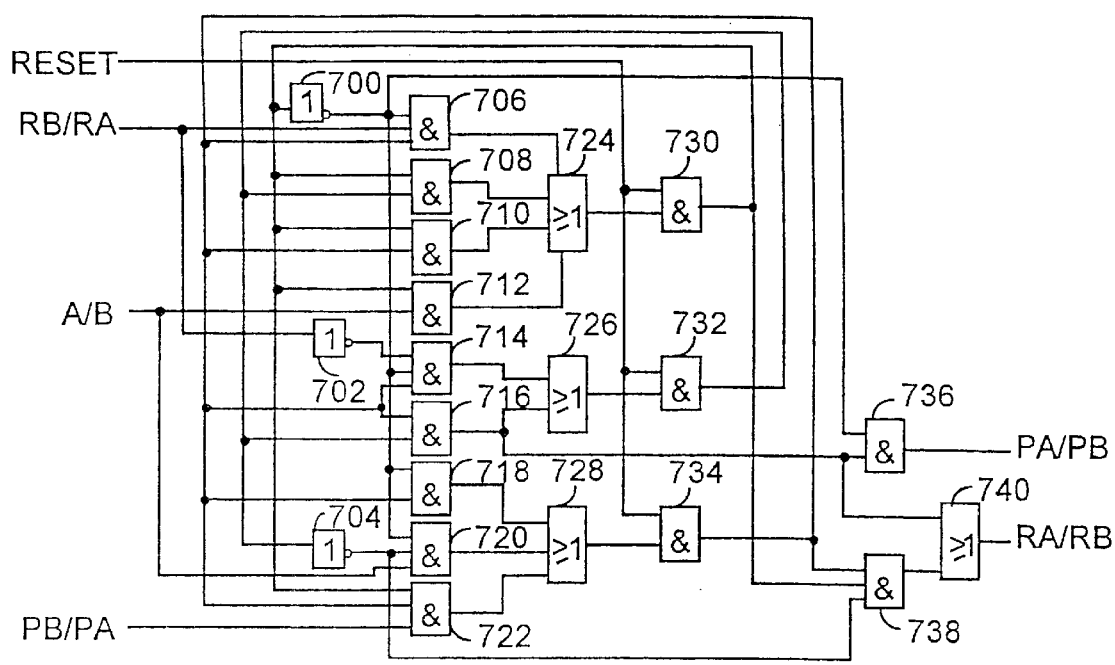
FIG. 7 illustrates and example of an implementation of a state machine.

FIG. 7 shows an example of the method of implementation of the state machines 200 and 202. On the basis of the state diagrams shown in FIGS. 5 and 6 a person skilled in the art can implement the state machines 200 and 202 in various different ways. FIG. 7 shows an example using inverters 700 to 704, AND gates 706 to 722, 736 and 738 and OR gates 724 to 728 and 740. The inputs of a state machine comprise a reset input RESET, which is used to reset the machine to zero, and the signals RB/RA, A/B and PB/PA, depending on whether the machine in question is the first state machine 200 or the second state machine 202. The outputs are the signals PA/PB and RA/RB.

Although the invention is described above with reference to an example illustrated in the accompanying drawings, it is obvious that the invention is not restricted thereto, but it can be modified in various ways within the inventive idea disclosed in the attached claims.

What is claimed is:

1. A method for performing phase comparison, wherein two asynchronous, functionally similar machines are used in the method, the method comprising:

feeding to a first asynchronous state machine, a first binary signal to be compared, an output signal of a second asynchronous state machine and a handshaking signal of the second asynchronous state machine, and feeding to the second asynchronous state machine a second binary signal to be compared, an output signal of the first asynchronous state machine and a handshaking signal of the first asynchronous state machine;

activating, by the first asynchronous state machine, its handshaking signal after detecting that the first binary signal to be compared is activated;

activating, by the second asynchronous state machine, its handshaking signal after detecting that the second binary signal to be compared is activated, the handshaking signals ensuring the logical operation of the method; and checking of a phase of the first binary signal to be compared and a phase of the handshaking signal of the second asynchronous state machine to determine when to activate the output signal of the first asynchronous state machine; and checking of a phase of the second binary signal to be compared and a phase of the handshaking signal of the first asynchronous state machine to determine when to activate the output signal of the second asynchronous state machine.

2. The method of claim 1, wherein the output signal and the handshaking signal of the first asynchronous state machine are activated for a duration of at least one phase if the first binary signal to be compared is only detected to be in an active phase, other signals received by the first asynchronous state machine remaining in a non-active phase; and the output signal and the handshaking signal of the second asynchronous state machine are activated for the duration of at least one phase if the second binary signal to be compared is only detected to be in an active phase, other signals received by the second asynchronous state machine remaining in a non-active phase.

3. The method of claim 2, further comprising:

setting the output signal of the first asynchronous state machine to a non-active phase, after the handshaking signal and the output signal of the first asynchronous state machine have been activated and the handshaking signal of the second asynchronous state machine has been activated;

keeping the handshaking signal of the first asynchronous state machine in an active phase for as long as the handshaking signal of the second asynchronous state machine is in an active phase after the handshaking signal and the output signal of the first asynchronous state machine have been activated and the handshaking signal of the second asynchronous state machine has been activated; and setting the output signal of the second asynchronous state machine to a non-active phase, after the handshaking signal and the output signal of the second asynchronous state machine have been activated and the handshaking signal of the first asynchronous state machine has been activated;

keeping the handshaking signal of the first asynchronous state machine in an active phase for as long as the handshaking signal of the first asynchronous state machine is in an active phase after the handshaking signal and the output signal of the first asynchronous state machine have been activated and the handshaking signal of the first asynchronous state machine has been activated.

4. The method of claim 2, further comprising:

keeping the output signal of the handshaking signal of the first asynchronous state machine in an active phase for as long as the handshaking signal of the second asynchronous state machine is in a non-active phase, and keeping the output signal and the handshaking signal of the second asynchronous state machine have been active phase for as long as the handshaking signal of the first asynchronous state machine is in a non-active phase.

5. The method of claim 1, further comprising:

activating the handshaking signal of the first asynchronous state machine for a duration of at least one phase if the handshaking signal of the second asynchronous state machine is detected to be in an active phase after the first binary signal to be compared has been activated, and activating the handshaking signal of the second asynchronous state machine for a duration of at least one phase if the, handshaking signal of the first asynchronous state machine is detected to be in an active phase after the second binary signal to be compared has been activated.

6. The method of claim 5, further comprising:

keeping the handshaking signal of the first asynchronous state machine in an active phase for as long as the output signal of the second asynchronous state machine is in an active phase, and keeping the handshaking signal of the second asynchronous state machine in an active phase for as long as the output signal of the first asynchronous state machine is in an active phase.

7. A phase comparator comprising:

the first and second asynchronous state machines, which are arranged to generate two output signals to control a phase, wherein the first and second asynchronous state machines are functionally similar, the first asynchronous state machine having, as input signals, a first binary signal to be compared, an output signal of the second asynchronous state machine and a handshaking signal of the second asynchronous state machine, the second asynchronous state machine having, as input signals, a second binary signal to be compared, an output signal of the first asynchronous state machine and a handshaking signal of the first asynchronous state machine;

the first asynchronous state machines being arranged to generate its handshaking signal based on an active edge of the first binary signal to be compared and the second asynchronous state machine being arranged to generate its handshaking signal based on an active edge of the second binary signal to be compared, the handshaking signals securing the logical operation of the phase comparator by detecting the active edge of each of the first and second binary signals to be compared;

the first asynchronous state machine being arranged to check a phase of the first binary signal to be compared and a phase of the handshaking signal of the second asynchronous state machine to determine when to activate the output signal of the first asynchronous state machine; and the second asynchronous state machine being arranged to check a phase of the second binary signal to be compared and a phase of the handshaking signal of the first asynchronous state machine to determine when to activate the output signal of the second asynchronous state machine.

8. The phase comparator of claim 7, wherein the first asynchronous state machine is arranged to activate its output signal for a duration of at least one phase if only the first binary signal to be compared is in an active phase, other signals received by the first asynchronous state machine being in a non-active phase, and the second asynchronous state machine is arranged to activate its output signal for a duration of at least one phase if only the second binary signal to be compared is in an active phase, other signals received by the second asynchronous state machine being in a non-active phase.

9. The phase comparator of claim 8, wherein, the first asynchronous state machine is arranged to keep its handshaking signal active for as long as the handshaking signal of the second asynchronous state machine is in an active phase after the handshaking signal and the output signal of the first asynchronous state machine and the handshaking signal of the second asynchronous state machine have been activated, and the second asynchronous state machine is arranged to keep its handshaking signal active for as long as the handshaking signal of the first asynchronous state machine is in an active phase after the handshaking signal and the output signal of the second asynchronous state machine and the handshaking signal of the first asynchronous state machine have been activated.

10. The phase comparator of claim 8, wherein the first asynchronous state machine is arranged to keep its output signal and its handshaking signal in an active phase for as long as the handshaking signal of the second asynchronous state machine is in a non-active phase, and the second asynchronous state machine is arranged to keep its output signal and its handshaking signal in an active phase for as long as the handshaking signal of the first asynchronous state machine is in a non-active phase.

11. The phase comparator of claim 7, wherein, the first asynchronous state machine is arranged to activate its handshaking signal for a duration of at least one phase if the handshaking signal of the second asynchronous state machine is in an active phase after the first binary signal to be compared has been activated, and the second asynchronous state machine is arranged to activate is handshaking signal for a duration of at least one phase if the handshaking signal of the first asynchronous state machine is in an active phase after the second binary signal to be compared has been activated.

12. The phase comparator of claim 11, wherein, the first asynchronous state machine is arranged to keep its handshaking signal in an active phase for as long as the output signal of the second asynchronous state machine is in an active phase, and the second asynchronous state machine is arranged to keep its handshaking signal active for as long as the output signal of the first asynchronous state machine is in an active phase.

* * * * *